United States Patent
Kawaguchi (10) Patent No.: US 6,225,868 B1
(45) Date of Patent: May 1, 2001

(54) VOLTAGE CONTROLLED OSCILLATION CIRCUIT WITH PLURAL VOLTAGE CONTROLLED CURRENT GENERATING CIRCUITS

(75) Inventor: Manabu Kawaguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/203,739

(22) Filed: Dec. 2, 1998

(30) Foreign Application Priority Data

Dec. 3, 1997 (JP) .................................................. 9-333171

(51) Int. Cl.[7] ................................................... H63B 5/04
(52) U.S. Cl. ........................ 331/34; 331/177 R; 331/16; 331/17
(58) Field of Search .................. 331/17, 8, 16, 331/34, 177 R (56) References Cited

U.S. PATENT DOCUMENTS

| | | | |
|---|---|---|---|
| 4,494,080 | * 1/1985 | Call | 331/8 |
| 5,245,218 | 9/1993 | Rinderle et al. | 307/60 |
| 5,302,919 | 4/1994 | Abe | 331/2 |
| 5,614,871 | 3/1997 | Miyabe | 331/111 |
| 5,635,878 | 6/1997 | Liu et al. | 331/57 |
| 5,821,824 | * 10/1998 | Mentzer | 331/57 |
| 5,942,947 | * 8/1999 | Bhagwan | 331/8 |

FOREIGN PATENT DOCUMENTS

| | | |
|---|---|---|
| 6-152401 | 5/1984 | (JP) . |
| 62-274913 | 11/1987 | (JP) . |
| 1-157612 | 6/1989 | (JP) . |
| 2-311009 | 12/1990 | (JP) . |
| 3-235512 | 10/1991 | (JP) . |
| 5-14136 | 1/1993 | (JP) . |
| 5-501180 | 3/1993 | (JP) . |
| 5-56370 | 3/1993 | (JP) . |
| 6-85625 | 3/1994 | (JP) . |
| 8-125528 | 5/1996 | (JP) . |
| 8-213901 | 8/1996 | (JP) . |
| 9-8567 | 1/1997 | (JP) . |
| 9-223960 | 8/1997 | (JP) . |
| 9-312565 | 12/1997 | (JP) . |
| 183297 | 5/1992 | (TW) . |
| 270256 | 2/1996 | (TW) . |
| 301822 | 4/1997 | (TW) . |

* cited by examiner

*Primary Examiner*—Arnold Kinkead
(74) *Attorney, Agent, or Firm*—Young & Thompson

(57) ABSTRACT

A voltage controlled oscillation circuit for use in a Phase Locked Loop circuit has a plurality of voltage controlled current generating circuits(60A,60B,60C), a current adder (62), and a current controlled oscillation circuit(70). Each of the voltage controlled current generating circuits has a control voltage-output current characteristic different from each other so as to stabilize a control voltage-oscillation frequency gain of the voltage controlled oscillation circuit against manufacturing variation of a voltage-current characteristic or a threshold voltage of transistors comprising said voltage controlled oscillation circuit.

5 Claims, 7 Drawing Sheets

VOLTAGE CONTROLLED OSCILLATION CIRCUIT WITH PLURAL VOLTAGE CONTROLLED CURRENT GENERATING CIRCUITS

BACKGROUND OF THE INVENTION

1. Field of the Invention

The present invention relates generally to a voltage controlled oscillation circuit and, more particularly, to a voltage controlled oscillation circuit used in a phase locked loop circuit constructed as an integrated circuit.

2. Description of the Related Art

Figure 1:
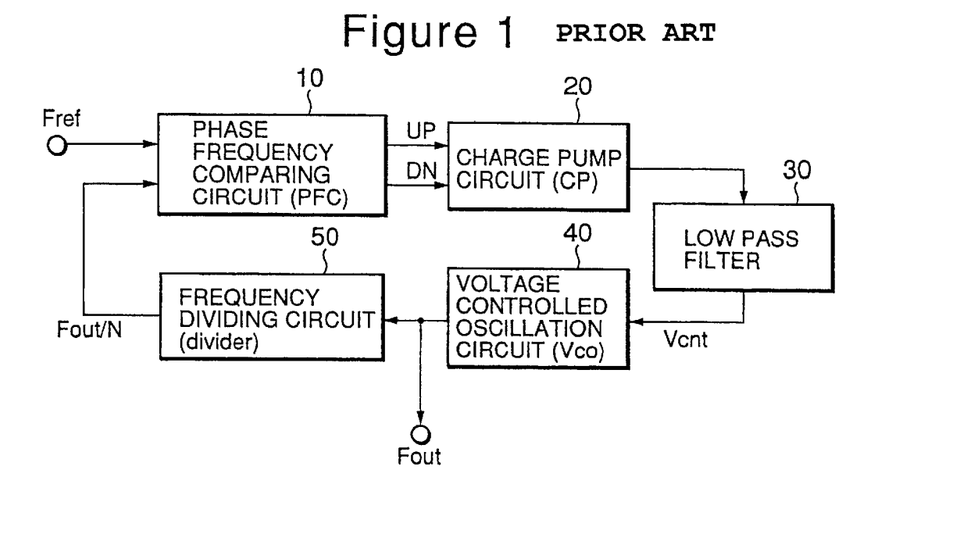
FIG. 1 is a block diagram of a PLL (phase-locked loop circuit).
Figure 2:
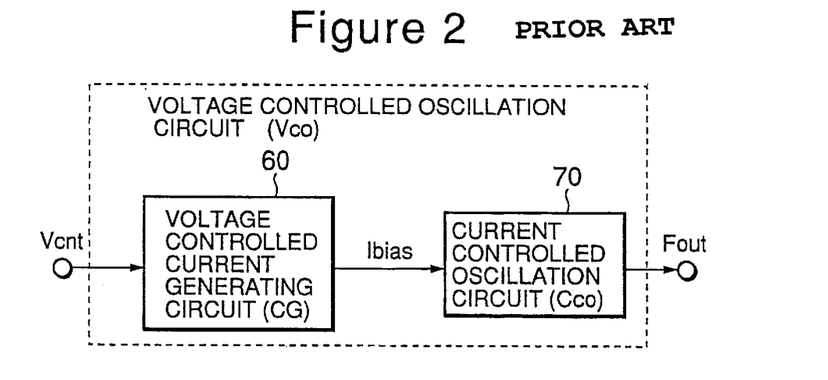
FIG. 2 is a block diagram of a voltage controlled oscillation circuit.

A voltage controlled oscillation circuit is generally constructed by using a Phase-Locked Loop (PLL) circuit. The phase-locked circuit (PLL) is, as illustrated in a block diagram of FIG. 1, constructed, as a feedback circuit, of a phase frequency comparing circuit (PFC) 10, a charge pump circuit (CP) 20, a low-pass filter (LPF) 30, a voltage controlled oscillation circuit (Vco) 40 and a frequency dividing circuit (divider) 50. Further, the voltage controlled oscillation circuit (Vco) 40 is, as shown in FIG. 2, constructed of a voltage controlled current generating circuit (CG) 60 and a current controlled oscillation circuit (Cco) 70.

The phase frequency comparing circuit (PFC) 10 receives as inputs both a reference signal (Fref) generated externally and an output signal (Fout/N) of the frequency dividing circuit (divider) 50. PFC 10 compares phases and frequencies of Fref and Fout/N, and generates control signals (UP and DOWN) having magnitudes in such a direction as to reduce differences therebetween. The charge pump circuit (CP) 20 receives input signals (UP and DOWN) from PFC 10, and charges and discharges a control voltage (Vcnt) through LPF 30. LPF 30 effects DC averaging of potential changes in the control voltage (Vcnt) due to charging/discharging currents from the charge pump circuit (CP) 20. The voltage controlled current generating circuit (CG) 60 generates a bias current (Ibias) proportional to input signal Vcnt, and the current controlled oscillation circuit (Cco) 70 outputs an oscillation signal Fout proportional to the bias current (Ibias). The frequency dividing circuit (divider) 50 receives oscillation signal Fout, and generates signal Fout/N, the frequency of which is the frequency of Fout divided by N.

The PLL circuit constructed above compares the frequency and/or phase of the reference signal Fref with the frequency and/or phase of the signal Fout/N, the frequency of which is the frequency of the oscillation output signal Fout of the voltage control oscillation circuit (Vco) is divided by N. The PLL circuit utilizes a feedback loop to reduce differences between the respective frequencies and phases of Fref and Fout/N, thereby obtaining an oscillation output signal Fout synchronized in frequency and phase with the reference signal Fref.

Electrical characteristics such as the voltage-current characteristic and threshold of a transistor constituting the integrated voltage controlled oscillation circuit (Vco) 40, largely change depending upon variations in manufacturing conditions. Corresponding to this, the input control voltage (Vcnt)-oscillation signal Fout characteristic of the voltage control oscillation circuit (Vco) 40 also changes. Even if there is variation in the manufacturing conditions, the output signal Fout of the voltage controlled oscillation circuit (Vco) 40 is synchronized with a desired frequency. It is common to design extra gain into the control voltage (Vcnt)-oscillation Fout characteristic so as to obtain the desired Fout oscillation frequency corresponding to the available control voltage Vcnt range regardless of variation.

On the other hand, even if a minute amount of noise enters the input voltage (Vcnt) of the voltage controlled oscillation circuit (Vco) 40, the frequency of the oscillation output signal Fout fluctuates in proportion to fluctuations in the input voltage (Vcnt), and jitter occurs. The magnitude of this jitter is proportional to the gain of the input voltage (Vcnt)-oscillation signal (fout) frequency characteristic of the voltage controlled oscillation circuit (Vco) 40. Accordingly, the voltage controlled oscillation circuit (Vco) 40 exhibiting a low gain is required for attaining the phase-locked loop circuit (PLL) having a low jitter characteristic. Further, it is of importance for designing the phase-locked loop circuit (PLL) to obtain the ensured synchronizing operation and a low jitter characteristic.

Figure 3:
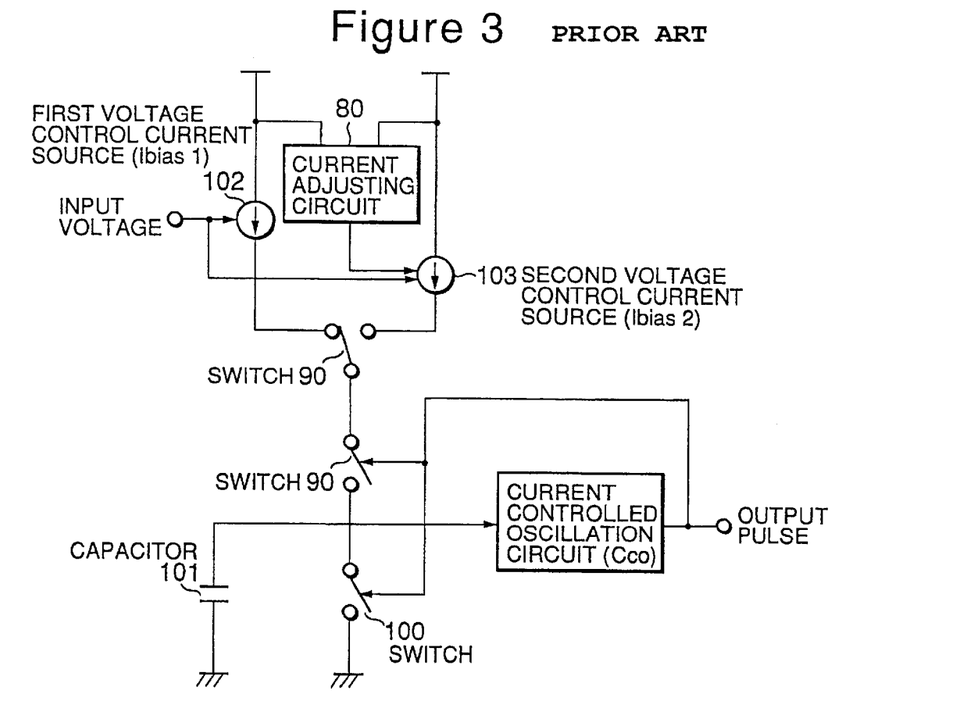
FIG. 3 is a circuit diagram showing a construction of a prior art voltage controlled oscillation circuit.

FIG. 3 shows a circuit construction proposed in Japanese Patent Application Laid-Open No. Hei 2-311009 as an example of the voltage controlled oscillation circuit (Vco) 40 which hitherto has been used in the phase-locked loop circuit (PLL).

The voltage controlled oscillation circuit (Vco) shown in FIG. 3 uses separate first and second voltage controlled current generating circuits (Ibias1, Ibias2) 102, 103 for forming the control voltage (Vcnt). The gain of the control voltage (Vcnt)-oscillation frequency (fout) characteristic of the voltage controlled oscillation circuit (Vco) when using the second voltage controlled current source (Ibias2) is lower than when using the first voltage control current source (Ibias1) 102.

Provided further are a current adjusting circuit 80 for adjusting the characteristic of the second voltage controlled current source (Ibias2) 103 in order to equalize the bias currents (Ibias1, Ibias2) of the first and second voltage controlled current sources 102, 103, and an external control signal (a switch 90) for switching the driving current source of the oscillation circuit with the first voltage controlled current source (Ibias1) 102 and the second voltage control current source (Ibias2) 103. The current adjusting circuit 80 includes a circuit for making a comparison between the current values of the first and second voltage controlled current sources (Ibias1, Ibias2) 102, 103, and a counter circuit for receiving a result of this comparison and adjusting the current value of the second voltage controlled current source (Ibias2) 103 by addition and subtraction.

When starting the phase-locked operation of the phase-locked loop circuit (PLL), the phase/frequency synchronization is effected by use of the first voltage controlled current source (Ibias1) 102 having a large gain of the control voltage (Vcnt)-oscillation output signal (fout) characteristic. Simultaneously with this, the current adjusting circuit 80 adjusts the current by increasing and decreasing a value of a counter circuit so that the value of the bias current (Ibias2) of the second voltage controlled current source 103 is equalized to the value of the bias current (Ibias1) of the first voltage controlled current source 102. After achieving synchronism of the frequency and/or phase of the phase-locked loop circuit (PLL), the operation of the counter circuit is stopped by the external control signal (the switch 90), and the counter circuit value is set to a fixed state. The characteristic of the control voltage (Vcnt)-oscillation output signal (fout) in this state becomes as shown in FIG. 4, with operating point C.

Figure 4:
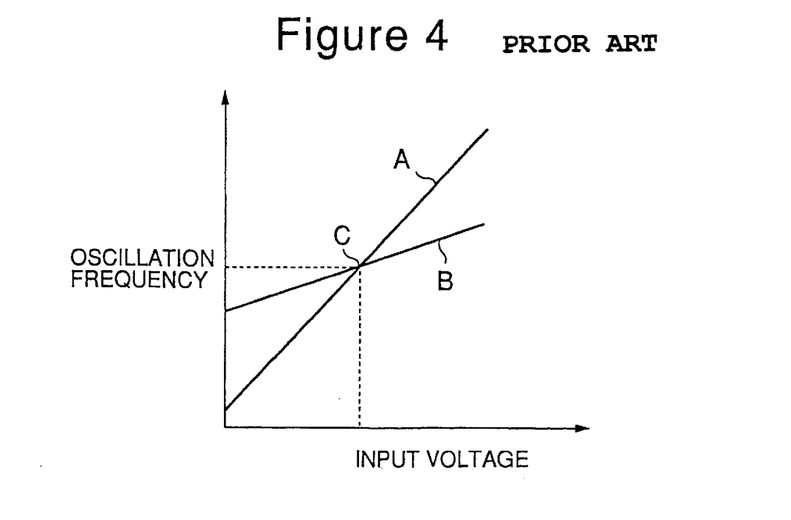
FIG. 4 is a characteristic diagram showing the prior art voltage controlled oscillation circuit shown in FIG. 3.

Next, in this state, the current source is switched by the external control signal (the switch 90) from the first voltage controlled current source (Ibias1) 102 to the second voltage controlled current source (Ibias2) having the low current gain. The input voltage (Vcnt)-oscillation frequency (fout)

characteristic of the voltage controlled oscillation circuit (Vco) is changed from characteristic A to characteristic B in FIG. 4 while maintaining the operating point of the phase-locked loop circuit (PLL).

When starting the phase-locked operation of the phase-locked loop circuit (PLL), a frequency bandwidth of the oscillation output signal is increased by using the first voltage controlled current source (Ibias1) 102 having a large gain, and, even if there is a deviation in the oscillation frequency due to the variation in the manufacturing conditions, the operation can be surely performed at a desired frequency.

Moreover, after an end of the phase-locked operation of the PLL circuit, the current source is switched to the second voltage controlled current source (Ibias2) 103, thereby decreasing the gain of the control voltage (Vcnt)-oscillation signal output (Fout) characteristic and also decreasing the jitter characteristic.

However, the voltage control oscillation circuit Vco of prior art phase-locked loop circuit (PLL) described above, because of switching in the input voltage (Vcnt)-oscillation frequency (fout) characteristic, requires the external control signal terminal and the circuit for determining phase-locked operation, and further the current adjusting circuit 80 for the first current source (Ibias1) and the second current source (Ibias2), which leads to problems such as an increase in the number of input terminals and an increase in circuit size.

SUMMARY OF THE INVENTION

Accordingly, it is an object of the present invention to provide a novel voltage controlled oscillation circuit that avoids the above problems of the prior art.

It is another object of the present invention to provide a voltage controlled oscillation circuit having a stabilized input voltage-oscillation frequency gain characteristic regardless of variations in manufacturing conditions of characteristics of a transistor within the voltage control oscillation circuit.

It is another object of the present invention to provide a voltage controlled oscillation circuit which operates surely at a desired frequency regardless of variations in manufacturing conditions of a phase-locked circuit and improves the jitter characteristic.

DESCRIPTION OF THE PREFERRED EMBODIMENTS

Next, embodiments of a voltage controlled oscillation circuit according to the present invention will be described with reference to the accompanying drawings.

Figure 5:
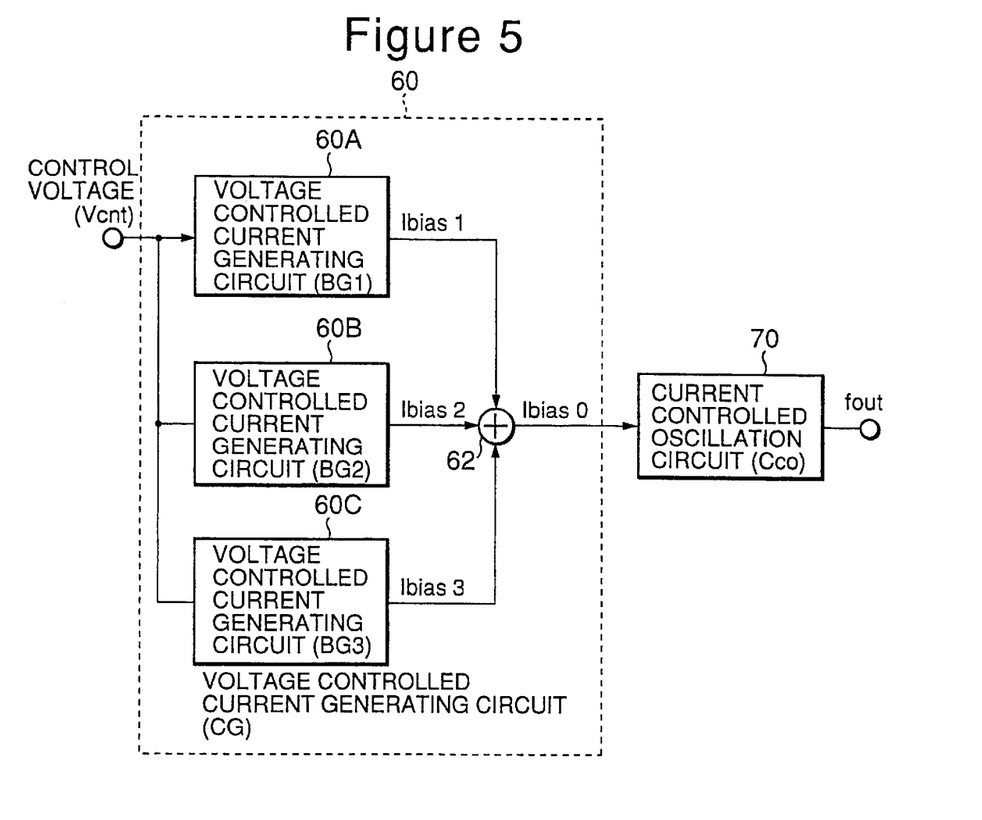
FIG. 5 is a block diagram showing an embodiment of a voltage controlled oscillation circuit of the present invention.

FIG. 5 is a block diagram based on the voltage controlled oscillation circuit (Vco) of the present invention.

In FIG. 5, the voltage controlled oscillation circuit (Vco) in this embodiment is constructed to have a voltage controlled current generating circuit (CG) 60 and a current controlled oscillation circuit (Cco) 70.

As shown in FIG. 5, the voltage controlled oscillation circuit (Vco circuit) in this embodiment includes a first voltage controlled current generating circuit (CG1) 60A having a control voltage (Vcnt) as an input, and second and third voltage controlled current generating circuits (CG2, CG3) 60B, 60C having input control voltage-output current characteristics different from that CG1, and output currents (Ibias1, Ibias2, Ibias3) of the respective voltage controlled current generating circuits are added by an adder 62, the output of which is Ibias0. A current control oscillation circuit (Cco) 70 receives Ibias0 as an input.

FIGS. 6–9 are characteristic diagrams of the voltage controlled current generating circuit.

Figure 6:
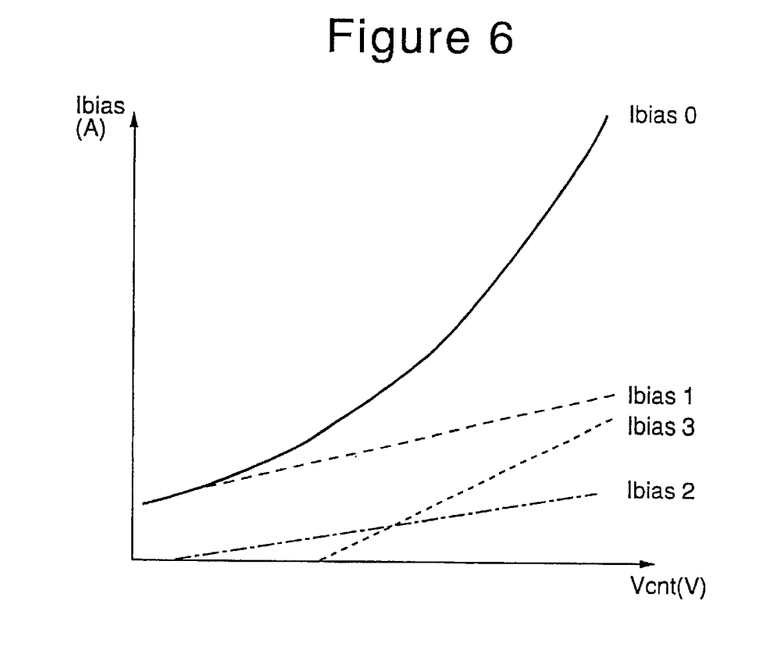
FIG. 6 is a characteristic diagram showing a principle of the voltage controlled oscillation circuit.

FIG. 6 is a diagram showing a control voltage (Vcnt)-output current (Ibias) characteristic of the voltage controlled current generating circuit (CG) in terms of characteristics (Ibias1, Ibias2, Ibias3) of the first, second and third voltage controlled current generating circuits, and a characteristic (Ibias0) of a sum thereof.

Figure 7:
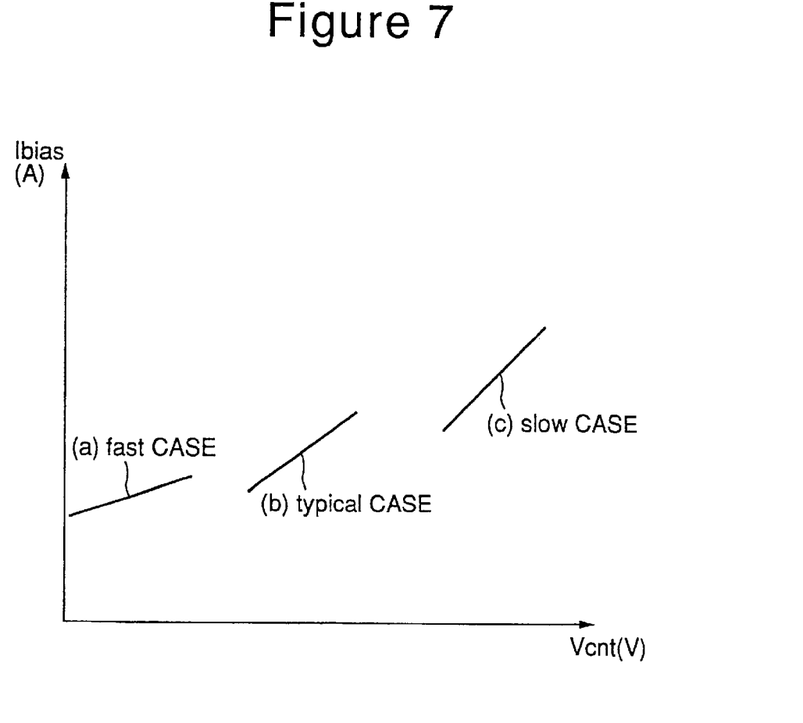
FIG. 7 is a characteristic diagram showing a principle of the voltage controlled oscillation circuit.

FIG. 7 illustrates a characteristic of the voltage controlled current generating circuit (CG), which is necessary for steadily synchronizing with a desired frequency when there is a variation in manufacturing conditions. The gain is a characteristic equal to a jitter characteristic of the conventional voltage controlled oscillation circuit (Vco), together with a current characteristic required to be generated by the voltage controlled current generating circuit (CG) when the respective manufacturing conditions are (a) fast condition, (b) typical condition and (c) slow condition.

Figure 8:
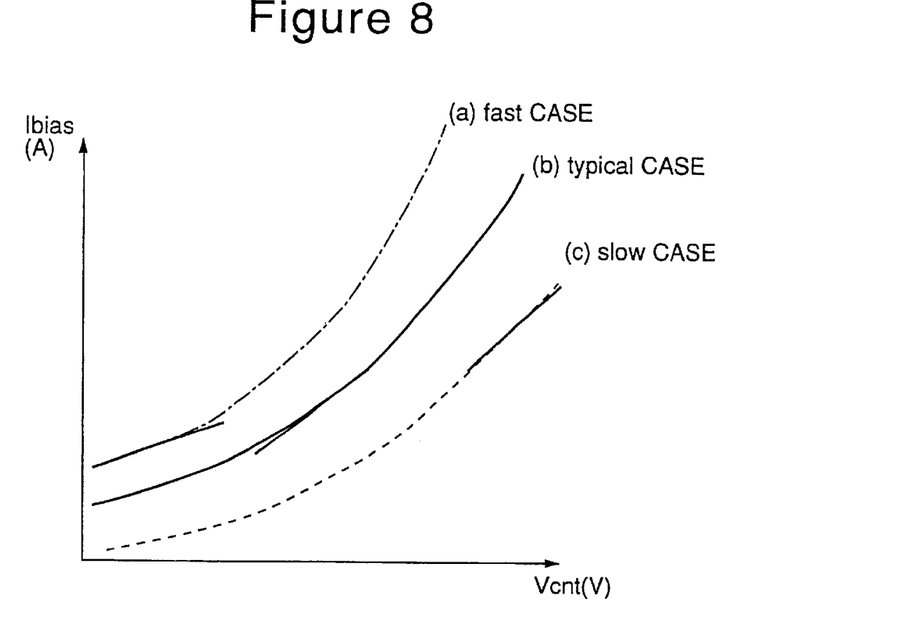
FIG. 8 is a characteristic diagram showing a principle of the voltage controlled oscillation circuit.
Figure 9:
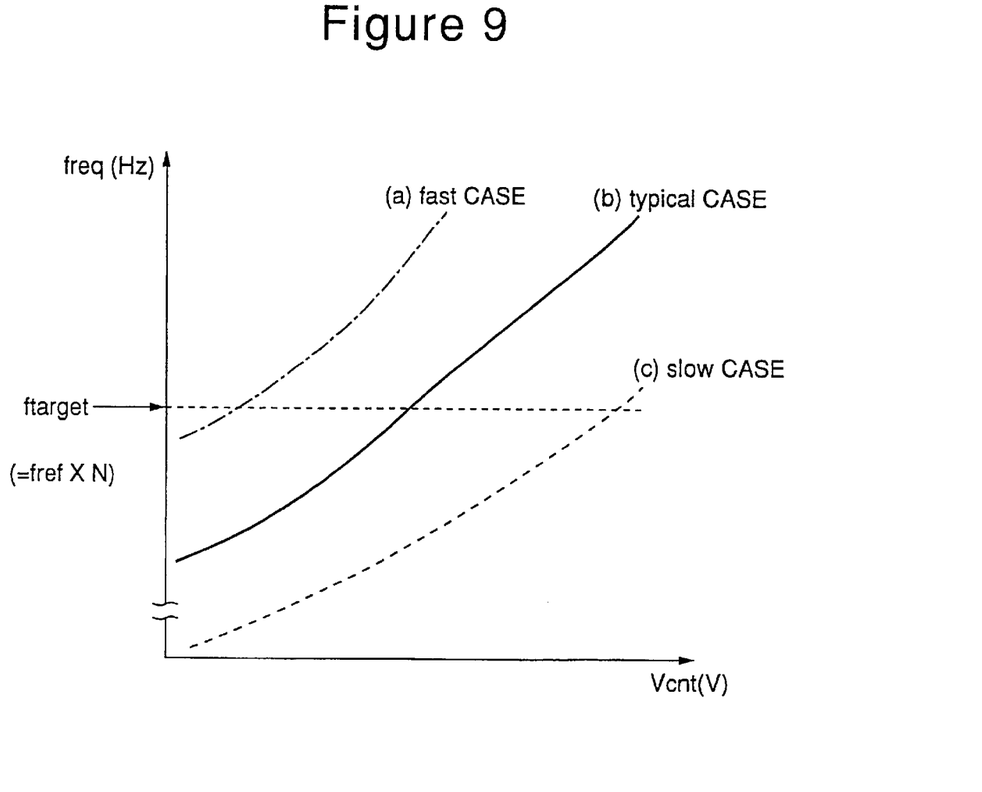
FIG. 9 is a characteristic diagram showing a principle of the voltage controlled oscillation circuit.

FIG. 8 is a diagram in which the characteristics used when there is a variation in the manufacturing conditions are overlaid on the characteristic of FIG. 7. Considering a time when the manufacturing conditions are varied in a direction of the (a) fast condition, the characteristic (Ibias1) of the first voltage controlled current generating circuit (CG1) 60A is optimally designed so as to be adapted to the characteristic (a) in FIG. 7.

Next, it is considered that the manufacturing condition is (b) typical condition, the characteristic (Ibias2) of the second voltage controlled current generating device (CG2) 60B is optimally designed so that a sum of the characteristic of the typical condition of the characteristic (Ibias1) of the first voltage controlled current generating circuit (CG1) 60A and the characteristic (Ibias2) of the second voltage controlled current generating circuit (CG2) 60B is accordant with the characteristic (b) in FIG. 7.

Further, when the manufacturing condition is (c) slow condition, the characteristic (Ibias3) of the third voltage controlled current generating device (CG3) 60C is optimally designed so that a sum of the characteristic of the slow condition of the characteristics (Ibias1+Ibias2) of the first and second voltage controlled current generating circuits (CG1, CG2) 60A, 60B and the characteristic (Ibias3) of the third voltage controlled current generating circuit (CG3) 60C.

As described above, the control current is generated corresponding to the case of the (a) fast condition in a low voltage region of the control voltage (Vcnt), corresponding to the case of the (b) typical condition in an intermediate voltage region, and corresponding to the case of the (c) slow condition in a high voltage region, and therefore the characteristics of the first, second and third voltage controlled current generating circuits (CG1, CG2, CG3) 60A, 60B, 60C can be independently determined. Then, the control voltage (Vcnt)-output oscillation (fout) characteristic of the voltage control oscillation circuit (Vco circuit) 40 in this embodiment becomes as shown in FIG. 5, it is feasible to reliably execute synchronization with a desired frequency even when the manufacturing conditions are varied, and a gain of the control voltage (Vcnt)-output oscillation (Fout) characteristic decreases. Namely, a low jitter characteristic is exhibited.

Figure 10:
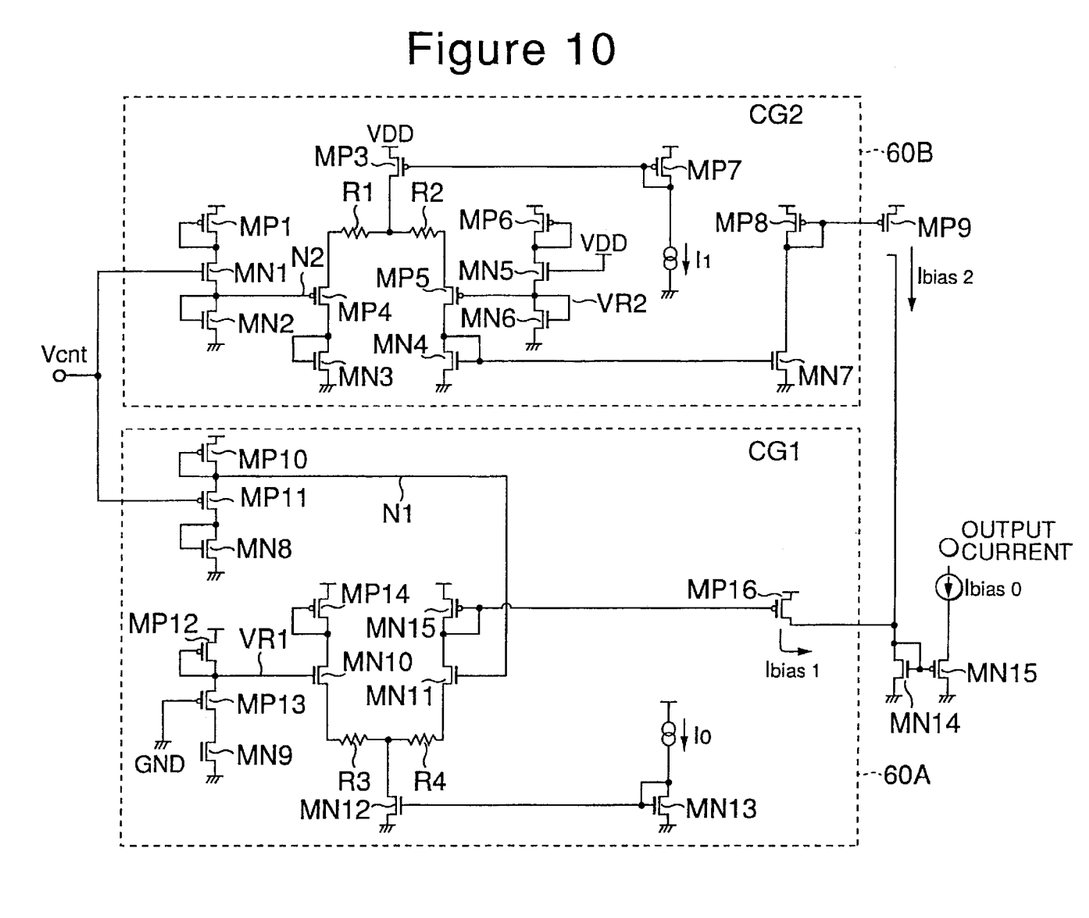
FIG. 10 is a circuit diagram showing an embodiment of the voltage controlled oscillation circuit of the present invention.

FIG. 10 is a diagram showing an example of a circuit construction in the embodiment carried out in a BiCMOS circuit with respect to this embodiment shown in FIG. 5.

CG1 represents a first voltage controlled current source, and CG2 designates a second voltage controlled current source. It is constructed of a current mirror circuit for taking a sum (Ibias1+Ibias2) of the output currents of the first and second voltage controlled current generating circuits (CG1, CG2), and generating the output current (Ibias0) to the current control oscillation circuit 70.

The first voltage controlled current generating circuit (CG1) 60A comprises an input circuit for receiving an input control voltage (Vcnt), a reference potential (VR1) circuit, a first constant current circuit (I0), and a comparing circuit for branching a current of the constant current circuit (I0) with an output voltage (N1) of the input circuit and an output voltage (VR1) of the reference potential circuit, and generating the output current (Ibias1) by the current mirror from a MOS transistor MP16.

The second voltage control current generating circuit (CG2) 60B comprises an input circuit, consisting of a MOS transistor, for receiving the input control voltage (Vcnt), a reference potential (VR2) circuit, a second constant current circuit (I1), and a comparing circuit for branching a current of the constant current circuit (I1) with an output voltage (N2) of the input circuit and an output voltage (VR2) of the reference potential circuit, and generating the output current (Ibias2) by the current mirror from a MOS transistor MP9.

Next, an example of operation of the voltage control oscillation circuit in the embodiment in FIG. 10 will be explained.

Figure 11:
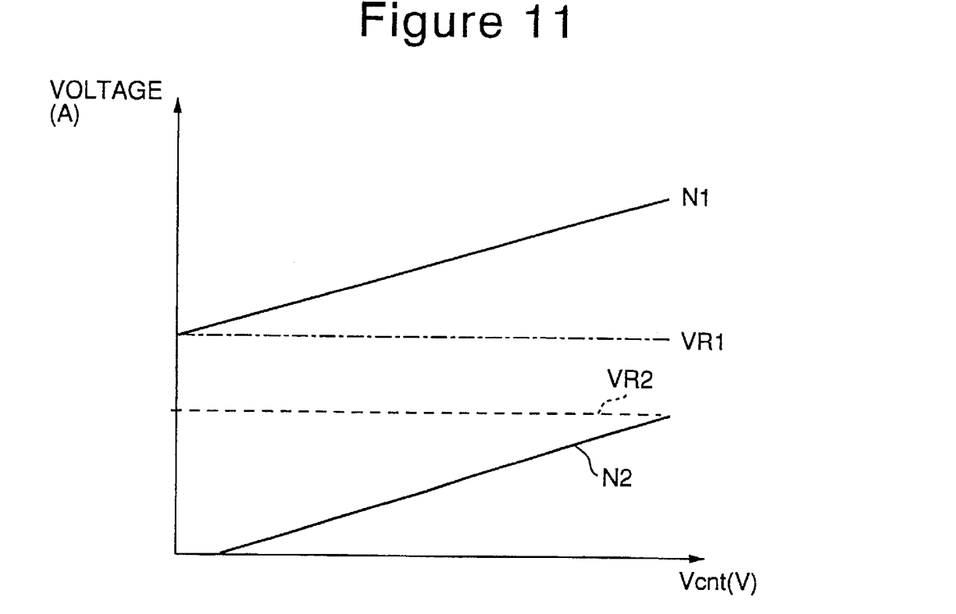
FIG. 11 is a characteristic diagram showing an example of operation of the voltage controlled oscillation circuit shown in FIG. 10.

In FIG. 10, the symbols MN1–MN15 represent n-type MOS transistors, the symbols MP1–MP16 designate p-type MOS transistors, and the symbols I0, I1 denote constant current circuits. Further, the control voltage (Vcnt)-output voltage characteristic and the reference potential characteristic of the input circuits constituting the first and second current control current sources are as shown in FIG. 11.

The output voltage (N1) of the input circuit and the reference potential (VR1) constituting the first voltage controlled current generating circuit (CG1) 60 are at an equal potential when the control voltage (Vcnt) is at the minimum potential, and the output potential (N1) of the input circuit increases in proportion to an increase in the control voltage (Vcnt).

The control voltage (Vcnt) is an input to the input circuit which produces output potential N2 in the second voltage controlled current generating circuit (CG2). The output potential (N2) of the input circuit is at the minimum potential when the control voltage (Vcnt) is at the minimum potential, and increases in proportion to a rise in the control voltage (Vcnt), and becomes equal to the reference potential (VR2) when the control voltage (Vcnt) is at the maximum potential.

Figure 12:
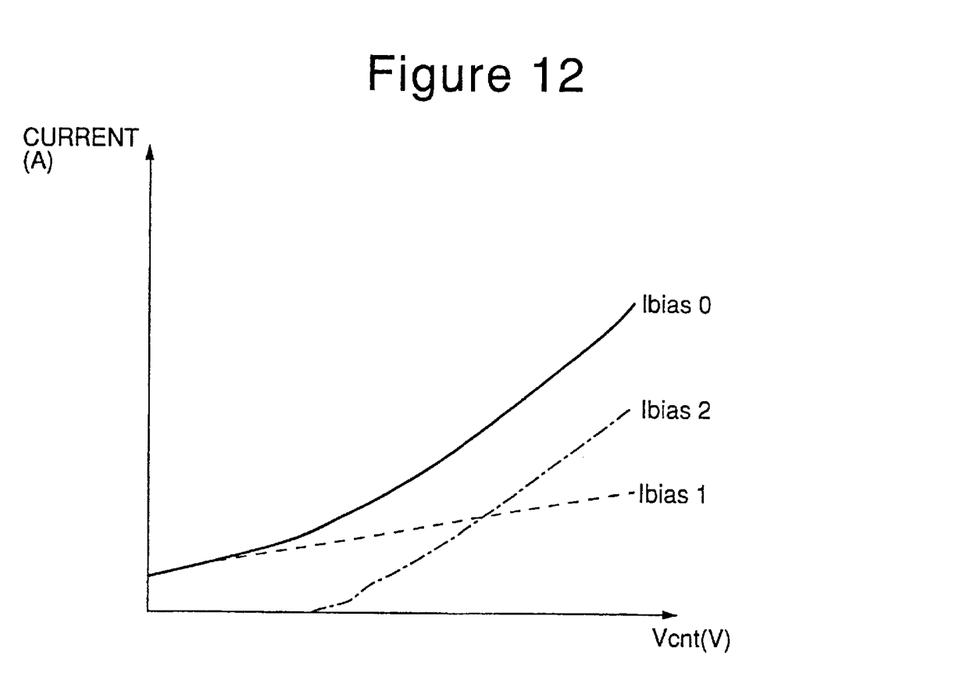
FIG. 12 is a characteristic diagram showing an example of operation of the voltage controlled oscillation circuit shown in FIG. 10.

In the first and second voltage controlled current circuits (CG1, CG2), the current characteristic outputted by the comparing circuit operating upon receiving the output voltage and the reference potential of the input circuit becomes as shown in FIG. 12.

In the first voltage controlled current circuit (CG1), when the control voltage (Vcnt) is at the minimum potential, the output voltage (N1) and the reference potential (VR1) of the input circuit are equal in potential, and hence the first constant current (I0) is split equally between the transistors MN10, MN11. As the control voltage (Vcnt) increases, the output potential (N1) of the input circuit becomes higher than the reference potential (VR1), and therefore the current passing through the transistor MN11 increases.

In the second voltage controlled current circuit (CG2), as the control voltage (Vcnt) rises from the minimum potential, the output potential (N2) of the input circuit increases, and, when the potential difference between the output potential (N2) and the reference potential (VR2) is smaller than a threshold voltage of the transistor MP5, the transistor MP5 starts conducting with the result that the output current passing through the transistor MP5 increases.

The output currents (Ibias1, Ibias2) of the first voltage controlled current generating circuit (CG1) and the second voltage controlled current generating circuit (CG2) are each added by the current mirror circuit and becomes as shown by the characteristic (Ibias0) in FIG. 12, thereby obtaining a driving current of the current controlled oscillation circuit (Cco circuit) 70.

As explained above, the voltage controlled oscillation circuit (Vco) in this embodiment has the first voltage controlled current generating circuit (CG1) serving as the driving current source of the voltage controlled oscillation circuit and two or more voltage controlled current generating circuits (CG2, . . . , CGn) exhibiting the control voltage (Vcnt)-output current (Ibias) gain different from those of the first voltage controlled current generating circuit (CG1). Then, the sum of the output currents (Ibias1, Ibias2, . . . , Ibias-n) of the respective voltage controlled current generating circuits (CG) is used as an input current of the current control oscillation circuit (Cco) 70. The characteristic of this input current is determined corresponding to the variation in the manufacturing conditions, and it is possible to stabilize a control voltage-oscillation frequency gain of the voltage controlled oscillation circuit against a manufacturing variations in voltage-current characteristics or a threshold voltage of transistors comprising the voltage controlled oscillation circuit. Consequently it is possible to effect the synchronization with the desired oscillation frequency band with respect to the variation in the manufacturing conditions without the external control signal nor the synchronization judging circuit. Further, the voltage controlled oscillation circuit (Vco) with a low jitter characteristic can be realized.

As obvious from the explanation given above, the voltage controlled oscillation circuit of the present invention includes the plurality of voltage controlled current generating circuits having different control voltage-output current characteristics, and the characteristics of the respective voltage controlled current generating circuits are different. Hence, if these characteristics are the ones determined corresponding to the variation in the manufacturing conditions, it is possible to effect the synchronization with the desired oscillation frequency bandwidth with respect to the variation in the manufacturing conditions, and the voltage controlled oscillation circuit exhibiting a low jitter characteristic can be realized.

While preferred embodiments of the present invention have been describe above, it is to be understood that the invention is to be defined by the appended claims when read in light of the specification and when accorded their full range of equivalents.

What is claimed is:

1. A voltage controlled oscillation circuit comprising:

a first voltage controlled current generating circuit;

a second voltage controlled current generating circuit;

a current adder adapted to add at least an output current of said first voltage controlled current generating circuit and an output current of said second voltage controlled current generating circuit to produce a final output current; and a current controlled oscillation circuit outputting an oscillation signal corresponding to said final output current, wherein said first voltage controlled current generating circuit outputs a first current corresponding to an input voltage when said input voltage ranges from a first voltage to a second voltage, and said second voltage controlled current generating circuit outputs a second current corresponding to an input voltage when said input voltage ranges from a third voltage to said second voltage and outputs a zero current when said input voltage ranges from said first voltage to said third voltage, said third voltage having a value between the values of said first voltage and said second voltage.

2. The voltage controlled oscillation circuit according to claim 1, wherein said second voltage is a higher voltage than said first voltage.

3. A voltage controlled oscillation circuit comprising:

a first voltage controlled current generating circuit;

a second voltage controlled current generating circuit;

a current adder adapted to add at least an output current of said first voltage controlled current generating circuit and an output current of said second voltage controlled current generating circuit to produce a final output current; and a current controlled oscillation circuit outputting an oscillation signal corresponding to said final output current, wherein said first voltage controlled current generating circuit comprises:

a first input circuit for receiving a control voltage whereby an output voltage of the first input circuit proportionally increases with an increase in the control voltage;

a first reference voltage generation circuit generating a first reference voltage; and a first comparing circuit comparing output voltage of said first input circuit with said first reference voltage, and outputting a first current corresponding to a difference between said output voltage and said first reference voltage.

4. The voltage controlled oscillation circuit according to claim 3, wherein said second voltage controlled current generating circuit comprises:

a second input circuit for receiving said control voltage and outputting voltage different from said output voltage of said first input circuit;

a second reference voltage generation circuit generating a second reference voltage different from said first reference voltage; and a second comparing circuit comparing an output voltage of said second input circuit with said second reference voltage, and outputting a second current corresponding to a difference between said output voltage of said second input circuit and said second reference voltage.

5. A voltage controlled oscillation circuit comprising:

a first voltage controlled current generating circuit;

a second voltage controlled current generating circuit;

a current adder adapted to add at least an output current of said first voltage controlled current generating circuit and an output current of said second voltage controlled current generating circuit to produce a final output current; and a current controlled oscillation circuit outputting an oscillation signal corresponding to said final output current, wherein said first voltage controlled current generating circuit comprises an N-channel MOS differential circuit for comparing said input voltage with a first reference voltage, said first voltage controlled current generating circuit outputting current corresponding to a difference between said input voltage and said first reference voltage, and said second voltage controlled current generating circuit comprises, a P-channel MOS differential circuit for comparing said input voltage with a second reference voltage, said second voltage controlled current generating circuit outputting current corresponding to a difference between said input voltage and said second reference voltage.

* * * * *